United States Patent [19]

Matsumoto et al.

[11] Patent Number: 5,341,324
[45] Date of Patent: Aug. 23, 1994

[54] SEMICONDUCTOR DEVICE AND MANUFACTURING METHOD THEREOF

[75] Inventors: Toshiyuki Matsumoto, Ibaraki; Hirofumi Inada, Amagasaki; Hiroshi Nittaya, Ikoma; Masahiro Kato, Kobe, all of Japan

[73] Assignee: Sumitomo Metal Industries, Ltd., Oaska, Japan

[21] Appl. No.: 953,699

[22] Filed: Sep. 30, 1992

[30] Foreign Application Priority Data

Oct. 4, 1991 [JP] Japan ................... 3-285729
Oct. 16, 1991 [JP] Japan ................... 3-298534
Sep. 24, 1992 [JP] Japan ................... 4-254875

[51] Int. Cl.$^5$ ............................................. G11C 11/24
[52] U.S. Cl. ........................................ 365/51; 365/149
[58] Field of Search ............ 365/51, 182, 149, 189.01, 365/230.01

[56] References Cited

U.S. PATENT DOCUMENTS

| | | |
|---|---|---|
| 4,887,135 | 12/1989 | Cheney et al. . |
| 4,929,989 | 5/1990 | Hayano . |
| 5,047,985 | 9/1991 | Miyaji ................. 365/203 |
| 5,181,188 | 1/1993 | Yamachi .............. 365/149 |

FOREIGN PATENT DOCUMENTS

| | | |
|---|---|---|
| 3939314 | 11/1989 | European Pat. Off. . |
| 0488366 | 11/1991 | European Pat. Off. . |

*Primary Examiner*—Terrell W. Fears
*Attorney, Agent, or Firm*—Armstrong, Westerman, Hattori, McLeland & Naughton

[57] ABSTRACT

A gate electrode of a P-channel MOS transistor and a gate electrode of an N-channel MOS transistor which constitute a logic section, a gate electrode of an N-channel MOS transistor and a capacitor electrode which constitute a memory cell section are formed by patterning a first layer of polysilicon, so that the semiconductor device can be manufactured in a considerably simplified process as an SRAM, while taking advantage of the large capacity of a DRAM thereby to improve the yield.

7 Claims, 11 Drawing Sheets

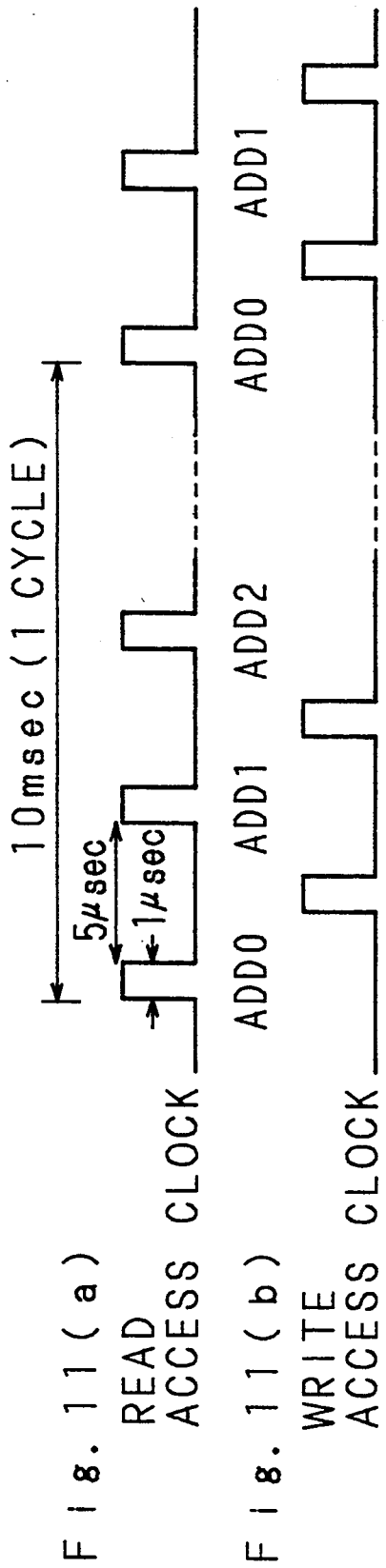

SEMICONDUCTOR DEVICE AND MANUFACTURING METHOD THEREOF

FIELD OF THE INVENTION

This invention relates to a semiconductor device such as an IC (Integrated Circuit) the like having a logic section and a memory cell section formed on the same substrate, and a manufacturing method thereof.

DESCRIPTION OF RELATED ART

FIG. 1 is a cross section indicating the structure of an essential part of a conventional DRAM (Dynamic Random Access Memory), in which references represent respectively: 1 an n$^-$-type substrate; 3 a p-type well; 4a, 4b, 4c, 4d device isolation regions.

The p-type well 3 is formed to a predetermined depth from the surface of part of the substrate 1. The device isolation regions 4a, 4b, 4c, 4d are separated at a predetermined distance from each other on the surface of the substrate 1. A logic section is provided on the left side of FIG. 1, with a memory cell section on the right side delimited by the device isolation region 4c. A P-channel MOS (Metal Oxide Semiconductor) transistor 7 and an N-channel MOS transistor 8 are respectively formed between the device isolation regions 4a and 4b and between the device isolation regions 4b and 4c in the logic section. Meanwhile, an N-channel MOS transistor 9 and a capacitor 10 are formed between the device isolation regions 4c and 4d of the memory cell section.

The P-channel MOS transistor 7 has P$^+$ diffusion regions 7a, 7b separated at a predetermined distance from each other with a predetermined depth below the surface of the substrate 1. At the same time, the P-channel MOS transistor 7 includes a gate electrode 7c astride the surfaces of the diffusion regions 7a, 7b with an insulating film 6b provided between the gate electrode 7c and the diffusion regions 7a, 7b.

On the other hand, in the N-channel MOS transistor 8, n$^+$ diffusion regions 8a, 8b are formed to a predetermined depth from the surface of the well 3 in the substrate 1, which are separated at a predetermined distance from each other. Moreover, a gate electrode 8c astrides the surfaces of the diffusion regions 8a, 8b with the insulating film 6b intervened.

Meanwhile, for the N-channel MOS transistor 9 in the memory cell section, there are formed n diffusion regions 9a, 9b below the surface of the well 3 between the device isolation regions 4c and 4d. The diffusion regions 9a, 9b of a predetermined depth are separated a predetermined distance. A gate electrode 9c over the surfaces of these diffusion regions 9a, 9b. The insulating film 6b separates the gate electrode 9c from the diffusion regions 9a, 9b.

Similarly, the capacitor 10 has an n$^+$ diffusion region 10a between the device isolation regions 4c and 4d and adjacent to the N-channel MOS transistor 9. The diffusion region 10a has also a predetermined depth from the surface of the well 3, over which is formed a capacitor electrode 10b with the insulating film 6a held therebetween.

The capacitor electrode 10b is obtained by patterning a first layer of polysilicon formed on the substrate 1. Each of the gate electrodes 7c, 8c, 9c of the P-channel MOS transistor 7 and the N-channel MOS transistors 8, 9 are formed by patterning a second layer of polysilicon on the substrate 1.

An essential process in the manufacture of the conventional semiconductor device as above will be depicted hereinafter with reference to a flowchart of FIG. 2.

In the first place, the p-type well 3 is formed to a predetermined depth from the surface at a predetermined n$^-$ area of the substrate 1 (step S1). The device isolation regions 4a, 4b, 4c, 4d are formed thereafter to set the area where the active regions are to be formed (step S2). Then, the diffusion region 10a of the capacitor 10 is formed by using a resist as a mask (step S3).

After removing the resist, an insulating film 6a is layered over the surface of the substrate 1 before the capacitor electrode 10b is formed (step S4). A first layer of polysilicon is put on the insulating film 6a (step S5) and patterned to form the capacitor electrode 10b. Then, prior to the formation of the gate electrodes for the transistors, the insulating film 6b is applied (step S6) and a second layer of polysilicon is formed (step S7) over the insulating film 6b. The second layer is patterned thereby to obtain the gate electrodes 7c, 8c, 9c for the transistors 7, 8, 9. Subsequently, ion implantation and diffusion are carried out using the above-obtained gate electrodes 7c, 8c, 9c as a mask, so that the p$^+$ and n$^-$ diffusion regions 7a, 7b, 8a, 8b, 9a, 9b are obtained (S8).

An insulating film 11 is layered all over the insulating film 6b including the surfaces of the gate electrodes 7c, 8c, 9c. Then, contact holes are formed in the insulating film 11 at positions corresponding to the diffusion regions 7a, 7b, 8a, 8b, 9a, 9b to expose the regions (step S9). A first Al layer is formed in a manner to fill the interior of the contact holes (step S10). The first Al layer is patterned to form wirings 12a, 12b, 12c, 12d, and an insulating film 13 is laid to cover the wirings 12a, 12b, 12c, 12d. Through holes to expose the wirings 12b, 12c are then formed at a predetermined positions of the insulating film 13 (step S11). After a second Al layer is arranged to fill the through holes (step S12) and patterned to obtain wirings 14a, 14b, a passivation film 15 is formed.

FIG. 3 is a block diagram of a conventional semiconductor device for driving a liquid crystal display circuits. In the drawing, references 101, 102, 103 respectively indicate a display data RAM, an interface control unit and a liquid crystal display driving circuit. The display data RAM 101 is constituted of, for example, a six-CMOS Transistor Static RAM Cell (where we call "a full CMOS SRAM"), and provided with not only a memory cell array having memory cells aligned in matrix, but a column predecoder, a read/write amplifier, a column selection switch, a row decoder, and a word line driver.

In usual data writing, the data are written into the memory cell corresponding to the address data through an input register 112. In data reading, the data in the memory cell corresponding to the address data is outputted to an output register 113. Further, in displaying data on the liquid crystal display, the data of the memory cells connected to the same word line is outputted through a 64-bit display data latch 108 to the 64-bit liquid crystal display driving circuit 103.

An XY address counter 104 generates an address based on the correlative data ADC of an address of the SRAM and an output of a segment driver and the address data from an instruction register 114. A Z address counter 105 generates an address on the basis of an external clock CL and the display start line data inputted from a display start line register 106. The addresses are fed to display data RAM 101.

The interface control unit 102 is provided with an input/output buffer 111, the input resister 112, output register 113 and the instruction register 114. The input/output buffer 111 are inputted an enable signal E, a data/instruction signal D/I, a read/write signal R/W, a reset signal RST and chip selection data CS1, CS2, CS3 etc., from a CPU (not shown) or the like, and moreover, the input/output buffer 111 supplies data $DB_0$–$DB_7$ to be written and a control signal to the input register 112 or data read from the output register 113 to the input register 112.

The input register 112 outputs the data for formation of an address and a control signal to the instruction register 114 and the data $DB_0$–$DB_7$ to the display data RAM 101. The instruction register 114 is connected to the XY address counter 104, the display start line register 106 and a display ON/OFF control unit 107, with outputting the address data to the XY address counter 104 and the display start line register 106. Moreover, the instruction register 14 sends a control signal to the display ON/OFF control unit 107.

The reset signal RST is inputted with a suitable timing to the input/output buffer 111, the display start line register 106 and the display ON/OFF control unit 107. An ON or OFF signal from the display ON/OFF control unit 107 is given to the input/output buffer 111 and the display data latch 108, thereby to control the respective operation timing. The external clock CL and the ON or OFF signal from the display ON/OFF control unit 107 are inputted to the display data latch 108, based on which the display data is latched from the display data RAM 101, outputted to the liquid crystal display driving circuit 103, whereby the liquid crystal display driving circuit 103 generates a liquid crystal display driving signal. $V_{1R}$–$V_{4R}$ and $V_{1L}$–$V_{4L}$ in FIG. 3 are source lines for driving the liquid crystal display circuits.

The operation of the conventional liquid crystal display driving device when writing and reading the data to the display data RAM 101, and driving a liquid crystal display circuits will be discussed now.

(Write operation)

When the data to be written is inputted from the CPU (not shown) or the like to the input/output buffer 111 together with the address data and the other control signals, the write data is stored in the input register 112, while the address data and the other control signals are sent to the instruction register 114. The instruction register 114 in turn feeds the address data to the XY address counter 104, and the other control signals and control data to the read/write amplifier and the display ON/OFF control unit 107 etc.

In consequence, the display data RAM 101 is set in the write mode. As the address generated by the XY address counter 104 is given to the display data RAM 101, a column of the memory cell array is selected through the column predecoder and the column selection switch (not shown) and also a row is selected through the row decoder and the word line driver. After completing the access to the memory cell, the counting value of the XY address counter 104 is increased, hence the data is sequentially written.

(Read operation)

When the address data to be read and the other control data and control signals are inputted to the input/output buffer 111 from the CPU (now shown) or the like, these are sent to the instruction register 114 via the input register 112. The instruction register 114 supplies the data and control signals to the XY address counter 104 and the display ON/OFF control unit 107 and the like, thus setting the display data RAM 101 in the read mode.

The address generated by the XY address counter 104 is sent to the column predecoder and the column selection switch, and also to the row decoder and the word line driver, similar to the write operation described above. Accordingly, a bit line and a word line where the memory cell corresponding to the address is present are selected. The data stored in the memory cell is read out as the data $DB_0$–$DB_7$ through the output register 113 and the input/output buffer 111. The counting value of the XY address counter 104 is increased after completing the access to read. The data is sequentially read in the similar manner to the above write operation.

(Driving operation of a liquid crystal display)

Upon receipt of a liquid crystal display start instruction and a display start address data from the CPU (not shown) or the like, the input/output buffer 111 sends them to the instruction register 114 through the input register 112 and further to the display start line register 106 and the display ON/OFF control unit 107. The display data RAM 101 is set in the .read mode for display, and accordingly the display data latch 108 is turned ON.

When the stored address data is set by the display start line register 106 to the Z address counter 105, a word line is selected via the row decoder (not shown). Each word line of the display data RAM 101 is sequentially activated by the word line driver. As a result, the data of the memory cells connected to the same word line is sent from the display data RAM 101 to the display data latch 108.

The display data latch 108 latches and outputs the data of the memory cells of one word line to the liquid crystal display driving circuit 103. The liquid crystal display driving circuit 103 generates a liquid crystal display driving signal. Segment outputs $V_1$–$V_{64}$ for driving the liquid crystal display are outputted to the liquid crystal display. The data is thus displayed on the liquid crystal display. When the access to read for display finishes, the counting value of the Z address counter 105 is increased to sequentially display the data.

In the prior art device as above, the capacitor electrode 10b is formed by using the first polysilicon layer and the gate electrodes 7c, 8c, 9c are formed by using the second polysilicon layer, respectively. Therefore, it is necessary to form the polysilicon layer twice. Moreover, the insulating film 6a, 6b to insulate the polysilicon layers should be formed twice. In other words, the number of manufacturing process inevitably increases, leading to the decrease of the yield and the rise of the manufacturing costs.

The conventional semiconductor device for driving a liquid crystal display uses a full CMOS SRAM or the like for the display data RAM 101. The reason is that although the SRAM has a disadvantage of a fraction of capacity comparing with the DRAM, the SRAM needs no refresh cycle because it retains the data by the flip-flop circuit, and can do with a smaller number of manufacturing processes. On the contrary, the DRAM retains the data by the capacitor, resulting in the increase of the number of the manufacturing processes for formation of the capacitor in comparison with the SRAM.

Moreover, the DRAM requires a refresh cycle to rewrite the data in a fixed time. That is, the DRAM is disadvantageous spite of the advantageous large capacity.

FIG. 4 is a flowchart of the manufacturing process of a full CMOS SRAM referred to above. Although the processes to form the well (step S21) and to set an active region (step S22) are the same as in the manufacture of the DRAM, the process related to the capacitor (steps S3, S4, S5) is abbreviated, skipped Lo the process to form a transistor polysilicon layer (step S24). Subsequently, similar to the manufacturing process of the DRAM, the process to form p+,a n− diffusion regions (step S25), the process to form the contact holes (step S26), the process to form the first Al layer (step S27), the process to form the through holes (step S28), the process to form the second Al layer (step S29) and the process to form the passivation film (step S30) are carried out, whereby the full CMOS SRAM is obtained.

However, enhancing the gradation, increasing the number of segments, or increasing the number of common lines (raising duty cycle), for example, in order to improve display quality, it is essential that the RAM has a large capacity, and therefore the use of the SRAM is increasingly disadvantageous.

SUMMARY OF THE INVENTION

This invention has been devised to solve the above described inconveniences inherent in the prior art and has for its first object to provide a semiconductor device of a large capacity and a manufacturing method thereof, whereby the manufacturing process is simplified, thus reducing the manufacturing costs and improving the yield.

A second object of this invention is to provide a semiconductor device for driving a liquid crystal display circuit which, taking advantage of a large capacity of a DRAM which is used as a display data RAM, simplifies the manufacturing process similar to an SRAM and substantially necessitates no refresh control circuit.

The above and further objects and features of the invention will more fully be apparent from the following detailed description with accompanying drawings.

BRIEF DESCRIPTION OF THE DRAWINGS

FIG. 11 is a timing chart of the operation when a liquid crystal display circuit is driven by the device of FIG. 10.

DESCRIPTION OF THE PREFERRED EMBODIMENTS

Figure 5:
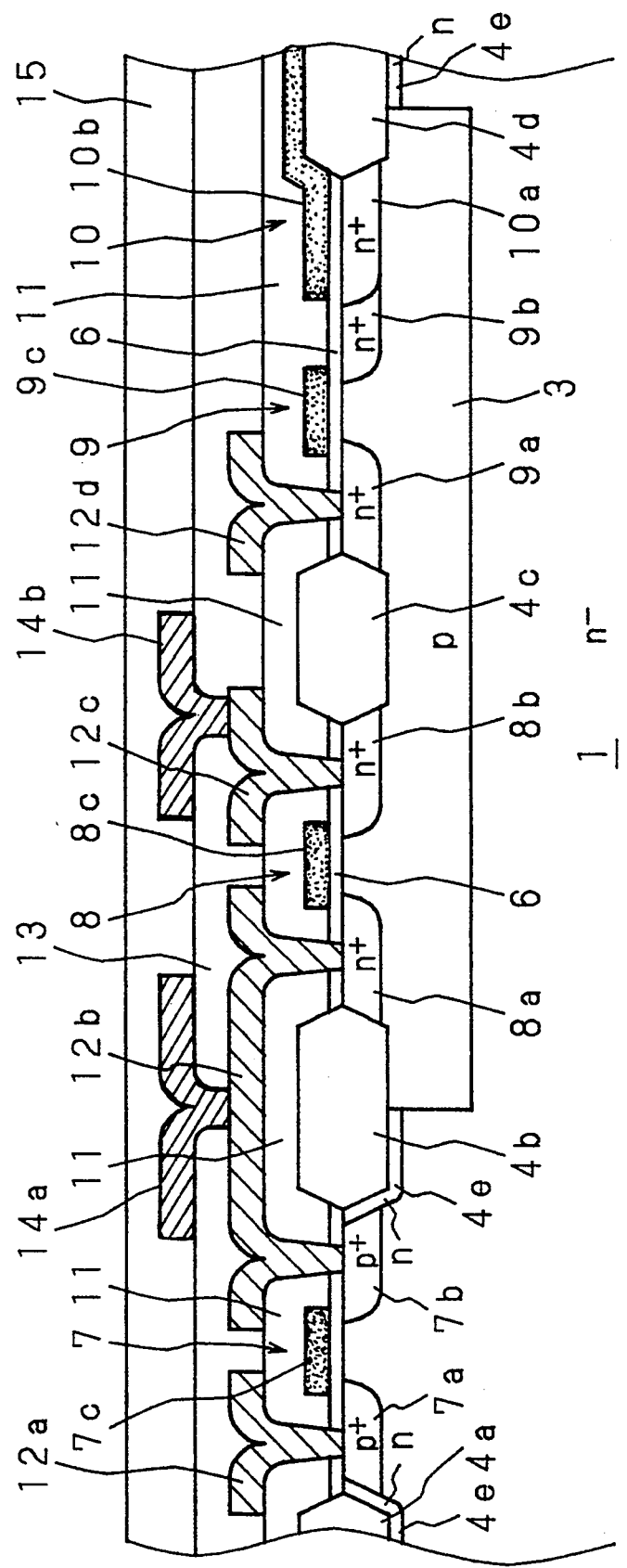
FIG. 5 is a cross section showing the structure of a semiconductor device according to this invention.

This invention will be depicted hereinafter with reference to the accompanying drawings of the preferred embodiments thereof. FIG. 5 is a cross section showing the structure of a semiconductor device of this invention, wherein numeral 1 designates an n−-type substrate (specific resistance=10 Ωcm) made of CZ silicon (silicon made by Czochralski method) of a single crystal, 3 designates a p-type well and 4a, 4b, 4c, 4d are device isolation regions.

By implanting B+ ions from part of the substrate 1 at $8 \times 10^{12}/cm^2$ dose rate width 30 keV accelerating voltage, the p-type well 3 of approximately 4 μm deep is formed. A plurality of the device isolation regions 4a, 4b, 4c, 4d of $SiO_2$, each 4000 Å thick and 10 μm wide, are formed at every 10 μm distance on the surface of the substrate 1. The regions 4a, 4b, 4c, 4d sink by approximately half the thickness thereof into the well 3.

The device isolation region 4a is formed at the n−-type area of the substrate 1, and the device isolation regions 4b, 4d are provided astride the n−-type area of the substrate 1 and the p-type area of the well 3. Moreover, the device isolation region 4c is found at the p-type area of the well 3. In FIG. 5, a P-channel MOS transistor 7 and an N-channel MOS transistor 8 constituting a logic section are on the left side and, and N-channel MOS transistor 9 and a capacitor 10 constituting a memory cell section are on the right side, delimited by the device isolation region 4c.

The P-channel MOS transistor 7 in the logic section is provided between the device isolation regions 4a and 4b. The N-channel MOS transistor 8 in the logic section is formed between the device isolation regions 4b and 4c. On the other hand, the N-channel MOS transistor 9 and the capacitor 10 are between the device isolation regions 4c and 4d.

In the P-channel MOS transistor 7 of the logic section, there are formed p+-type diffusion regions 7a, 7b respectively as a source and a drain by injecting $^{49}BF_2{}^+$ ions at $2 \times 10^{15} cm^2$ dose rate with 50 keV accelerating voltage from the surface of the substrate 1. The diffusion regions 7a, 7b are separated at a predetermined distance, each having a junction depth of approximately 0.35 μm. An approximately 200 Å thick insulating film 6 formed of $SiO_2$ as a gate oxide film separates the diffusion regions 7a, 7b from a gate electrode 7c made of polysilicon having 4000 Å thick in a manner to stretch over the diffusion regions 7a, 7b.

Similarly, the N-channel MOS transistor 8 has two n+-type diffusion regions 8a, 8b of junction approximately 0.2 μm deep, separated at a predetermined distance between the device isolation regions 4b and 4c . Each diffusion region is formed by implanting $^{75}As^+$ ions from the surface of the well 3 at $5 \times 10^{15}/cm^2$ dose rate with 80 keV accelerating voltage. The diffusion regions 8a, 8b work as a source and a drain, respectively. A gate electrode 8c is formed astride the surfaces of the diffusion regions 8a, 8b via the intervened insulating film 6.

On the other hand, in the N-channel MOS transistor 9 constituting the memory cell section, n+-type diffusion regions 9a, 9b as a source and a drain respectively are formed at a predetermined distance from each other between the device isolation regions 4c and 4d. By implanting $^{75}As^+$ ions from the surface of the well 3 at $5\times10^{15}/cm^2$ dose rate with 80 key accelerating voltage, the diffusion regions 9a, 9b which have the junction depth of about 0.2 μm are obtained. Moreover, a gate electrode 9c extends over the surfaces between the diffusion regions 9a, 9b via the insulating film 6.

Further, an n+-type diffusion region 10a is formed in the capacitor 10 by implanting $^{75}As^+$ ion at $3\times10^{14}/cm^2$ dose rate with 120 keV accelerating voltage to a predetermined depth below the surface of the well 3. At the same time, a capacitor electrode 10b is formed on the diffusion region 10a via the insulating film 6.

The gate electrodes 7c, 8c, 9c and the capacitor electrode 10b are all formed by patterning a first layer of polysilicon. A metal of a high melting point such as tungsten, molybdenum or the like may be employed in place of polysilicon.

An insulating film 11 of BPSG (Boron Phosphorus Silicate Glass) of 8000 Å thick covers all over the gate electrodes 7c, 8c, 9c of the P-channel MOS transistor and the N-channel MOS transistor of the logic section, the capacitor electrode 10b of the capacitor 10, a cell plate electrode 10c, the device isolation regions 4a, 4b, 4c, 4d, and the insulating film 6. On the insulating film 11 is formed wirings 12a, 12b, 12c, 12d by patterning a 6000 Å thick aluminum layer.

The wiring 12a is in touch with the diffusion region 7a of the P-channel MOS transistor 7 through contact holes in the insulating films 11, 6. The wiring 12b alike is held in contact with the diffusion region 7b of the P-channel MOS transistor 7 and the diffusion region 8a of the N-channel MOS transistor 8 through the contact holes in the insulating films 11, 6.

The other wirings 12c, 12d are respectively kept in touch with the diffusion region 8b of the N-channel MOS transistor 8 and the diffusion region 9a of the N-channel MOS transistor 9 through contact holes formed on the insulating film 11. An insulating film 13, approximately 12000 Å thick, is formed of $SiO_2$ plasma all over the wirings 12a, 12b, 12c, 12d and the insulating film 11. Wirings 14a, 14b on the insulating film 13 are obtained by patterning a second aluminum layer about 10000 Å thick.

The wirings 14a, 14b are in touch with the above wirings 12b, 12c via the through holes in the insulating film 13. A passivation film 15 of SiN about 8000 Å thick, is formed all over the upper surfaces of the wirings 14a, 14b and the insulating film 13.

After the research and development made by the inventors of this invention to achieve a semiconductor device which enjoys both a merit of the large capacity of a DRAM and a merit in the simpler manufacturing process of an SRAM, it has been detected to be considerably effective that the gate electrodes of the transistors in the logic section and the memory cell section, and the capacitor electrode of the memory cell section are formed by patterning the first layer.

Figure 8:
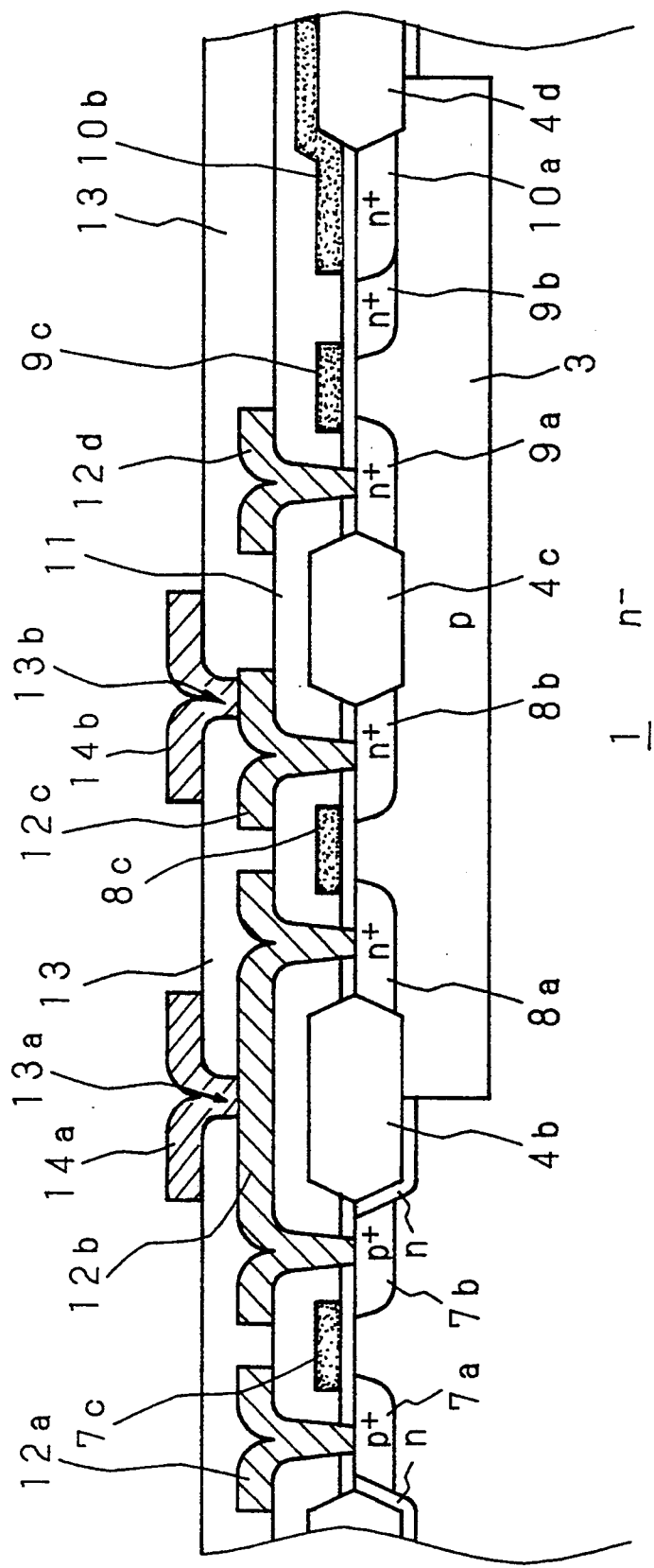
FIG. 8 is a diagram explanatory of the essential manufacturing process of the device of FIG. 5.
Figure 9:
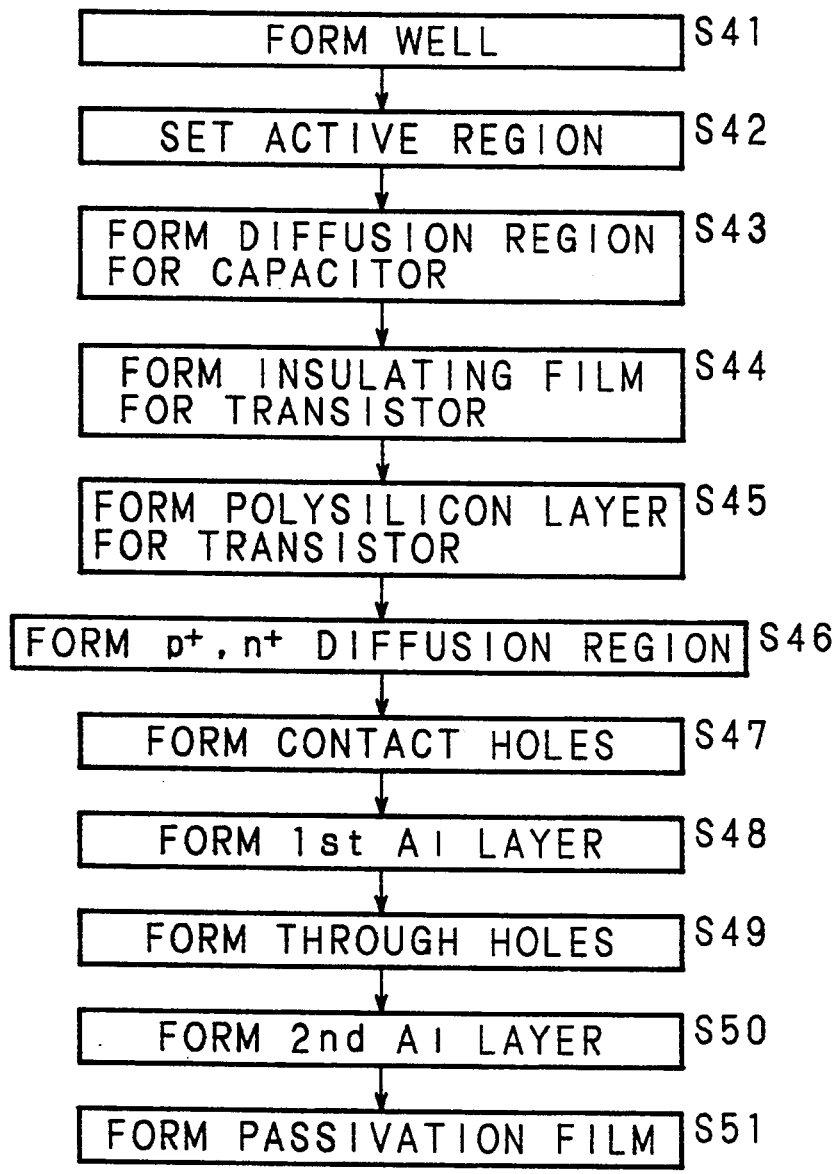
FIG. 9 is a flowchart of the essential manufacturing process of the device of FIG. 5.

The essential manufacturing process of the device as above will be discussed now. FIGS. 6, 7, 8 are explanatory diagrams of the essential manufacturing process of the semiconductor device and FIG. 9 is a flowchart thereof.

Figure 6A:
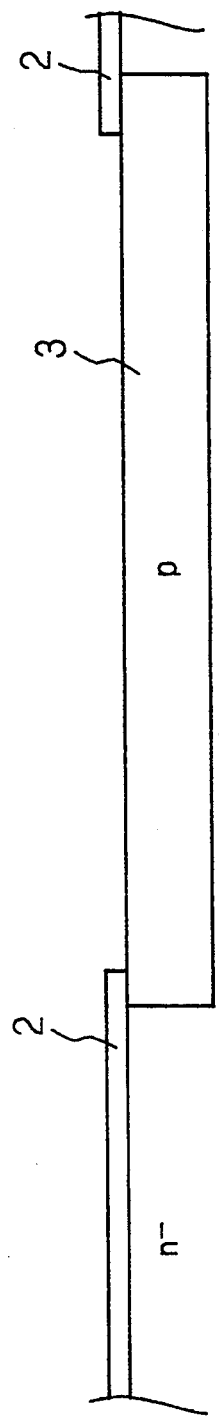
FIG. 6 is a diagram explanatory of the essential manufacturing process of the device of FIG. 5.
Figure 6B:
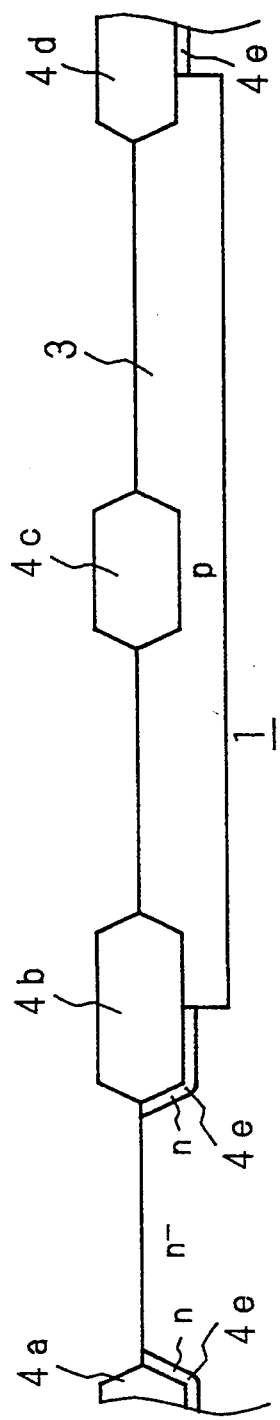
Figure 6C:
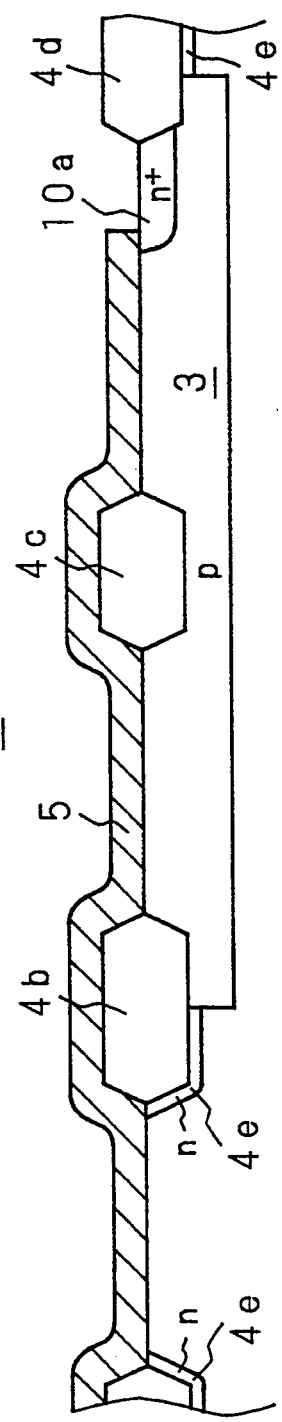

As shown in FIG. 6(a), a positive resist 2, for example, is patterned on the surface of the n⁻-type silicon substrate 1. Then, ions are injected and diffused while the positive resist 2 is used as a mask, so that the p-type well 3 is formed (step S41). After removing the positive resist 2, device isolation regions are formed to set an active region (step S42). Those isolation regions arc formed of a thick oxide films (LOCOS) 4a, 4b, 4c, 4d and a high concentration n-type region 4e. Thereafter, a resist 5 is applied except for an area where the diffusion region 10a is to be formed (FIG. 6(c)). While the resist 5 is used as a mask, the diffusion region 10a is formed by the implantation and diffusion of ions (step S43).

Figure 6D:
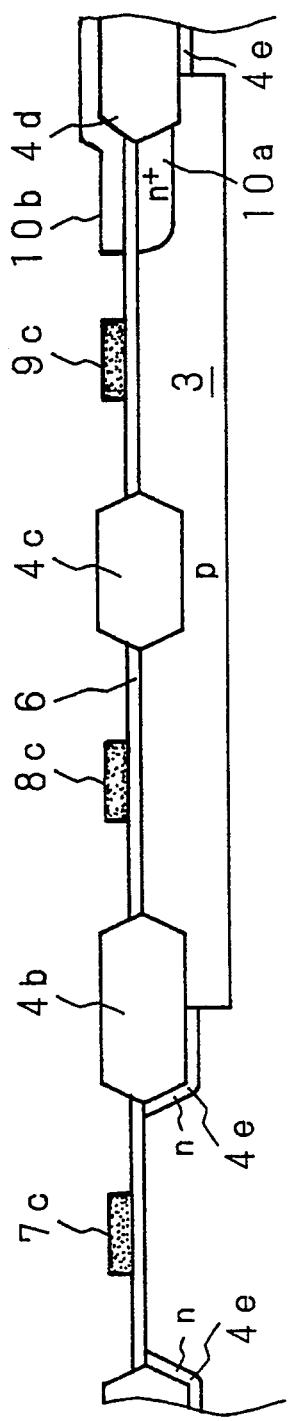

After the insulating film 6 of an oxide film etc., is formed on the surface of the substrate 1 including the surface of the well 3 while the resist 5 is removed (step S44), a first layer of polysilicon is formed and then patterned, thereby forming the gate electrodes 7c, 8c of the P-channel and N-channel MOS transistors 7, 8 in the logic section, the gate electrode 9c of the N-channel MOS transistor 9 of the memory cell section and the capacitor electrode 10b of the capacitor 10 (step S45), as indicated in FIG. 6(d).

Figure 7A:
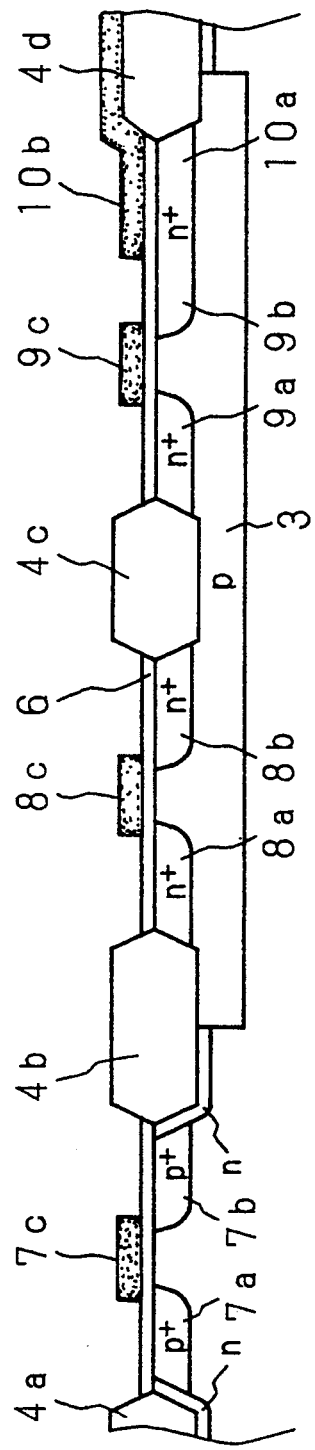
FIG. 7 is a diagram explanatory of the essential manufacturing process of the device of FIG. 5.
Figure 7B:
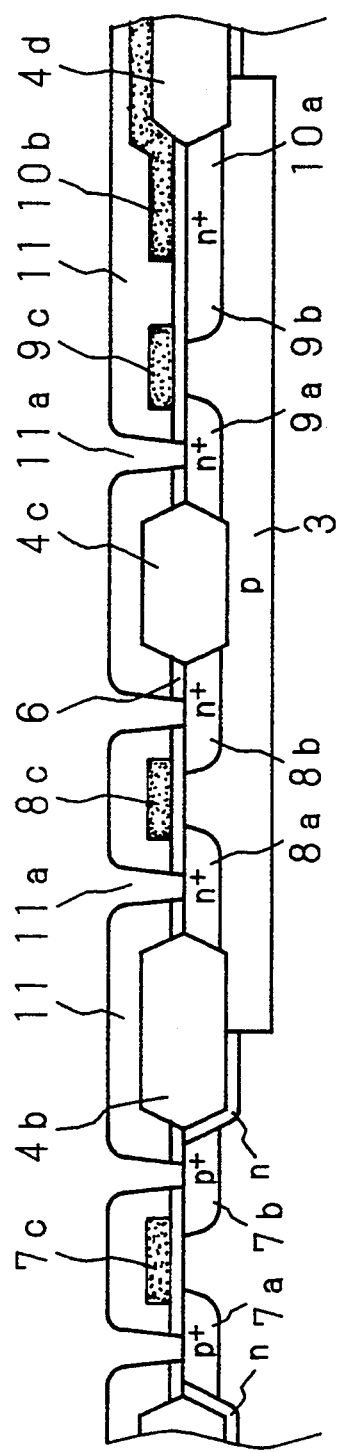
Figure 7C:
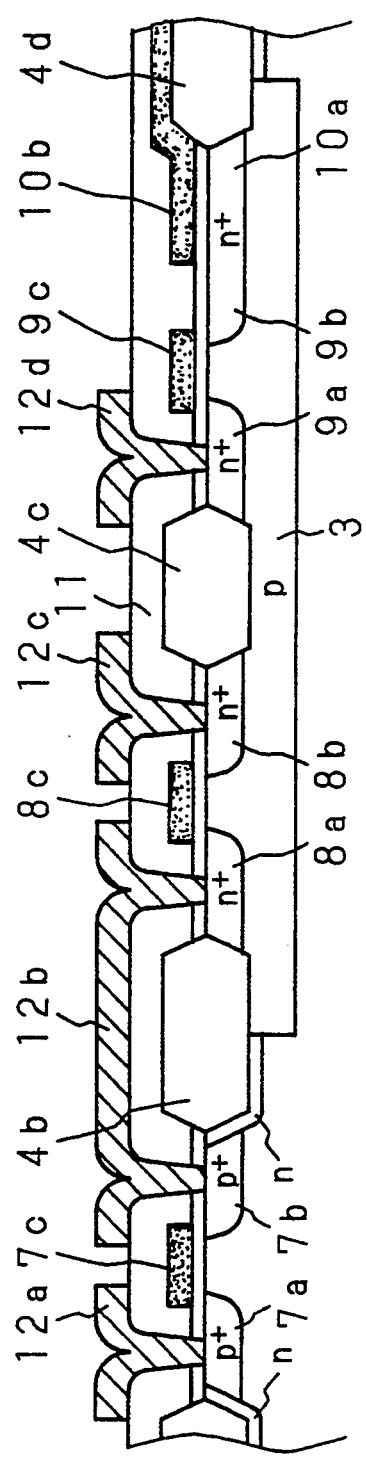

Using the device isolation regions 4a, 4b, 4c, 4d, the gate electrodes 7c, 8c, 9c and the capacitor electrode 10b as masks, each pair of source and drain for the transistor, namely, the diffusion regions 7a, 7b, 8a, 8b, 9a, 9b are formed as shown in FIG. 7(a) (step S46). Thereafter, the insulating film 11 is laminated all over time insulating film 6 including the diffusion regions 7a, 7b, 8a, 8b, 9a, 9b and, contact holes 11a are opened in the insulating film 11 at positions corresponding to the diffusion regions 7a, 7b, 8a, 8b, 9a so as to expose the diffusion regions as shown in FIG. 7(b) (step S47). A first Al layer is filled in the contact holes 11a, which is then patterned to obtain the wirings 12a, 12b, 12c, 12d in touch with the diffusion regions 7a, 7b, 8a, 8b, 9a as in FIG. 7(c) (step S48).

Then, as indicated in FIG. 8, the insulating film 13 is provided all over the insulating film 11 including the surfaces of the wirings 12a, 12b, 12c, 12d. Through holes 13a, 13b are formed in the insulating film 13 at positions corresponding to the wirings 12b, 12c (step S49). A second Al layer is filled in the through holes 13a. By patterning the Al layer, wirings 14a, 14b are formed in touch with the wirings 12b, 12c (step S50). Finally, all over the insulating film 13 including the surfaces of the wirings 14a, 14b is covered with the passivation film 15 as shown in FIG. 5. The manufacture of the semiconductor device is performed in the above-described manner.

The specification and characteristics of this device and according to this manufacturing method are compared with those of DRAM and a full CMOS SRAM used hitherto. The comparing result is indicated in Table 1.

As is clear from Table 1, although the cell size and the memory cell section of this device are larger as compared with those of the conventional DRAM, they are considerably smaller than in the full CMOS SRAM. Moreover, the data holding current can be smaller than that of the conventional DRAM. The manufacturing process is simplified to approximately 80% of the DRAM.

TABLE 1

|  | DRAM | This device | Full CMOS SRAM |
| --- | --- | --- | --- |
| Cell Size | 1 | 2 | 5-6 |
| RAM area | 1 | 1.5-2 | 5 |
| Date holding current | 1 mA | 100 μA | 1 μA |
| Refresh cycle | necessary | necessary | unnecessary |

TABLE 1-continued

|  | DRAM | This device | Full CMOS SRAM |
| --- | --- | --- | --- |
| Manufacturing process | complicated | simple | simple |
| Required days for Manufacture | 12 | 10 | 9.5 |

Figure 10:
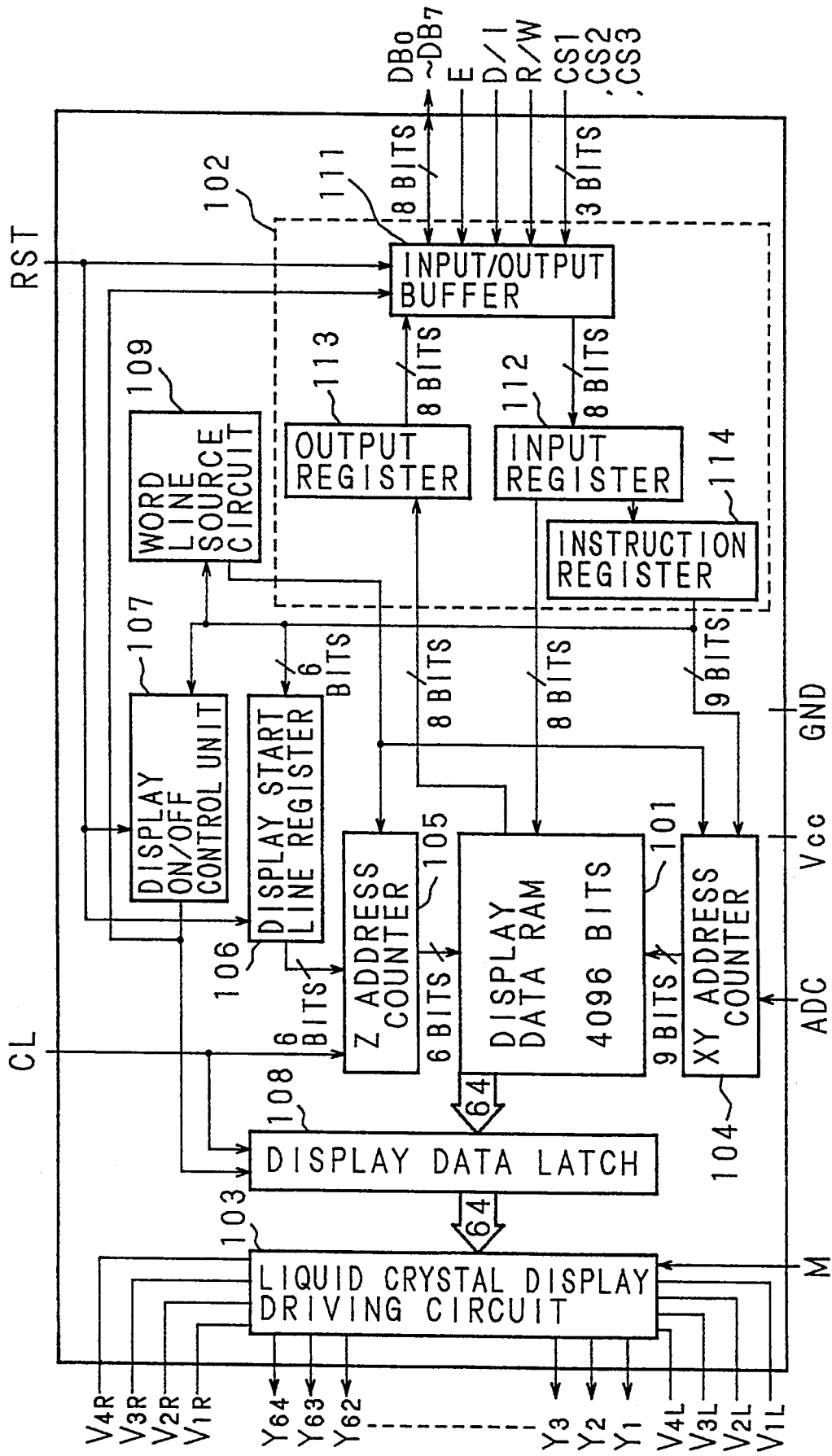
FIG. 10 is a block diagram of a semiconductor device for driving a liquid crystal display circuit according to this invention.

Now, a semiconductor device for driving a liquid crystal display circuit according to this invention will be discussed with reference to the accompanying drawings. FIG. 10 is a block diagram of the driving semiconductor device, in which numeral 101 indicates a display data RAM, numeral 102 designates an interface control unit and numeral 103 represents a liquid crystal display driving circuit.

The display data RAM 101 is constituted of the same DRAM as shown in FIG. 5, consisting of a memory cell array having many memory cells aligned in matrix, a column predecoder for selecting a column where a memory cell in the memory cell array is present, a read/write amplifier, a column selection switch, a row decoder for selecting a row where a memory cell is present, a word driver, a read amplifier for liquid crystal display, and a row selection switch etc.

Figure 1:
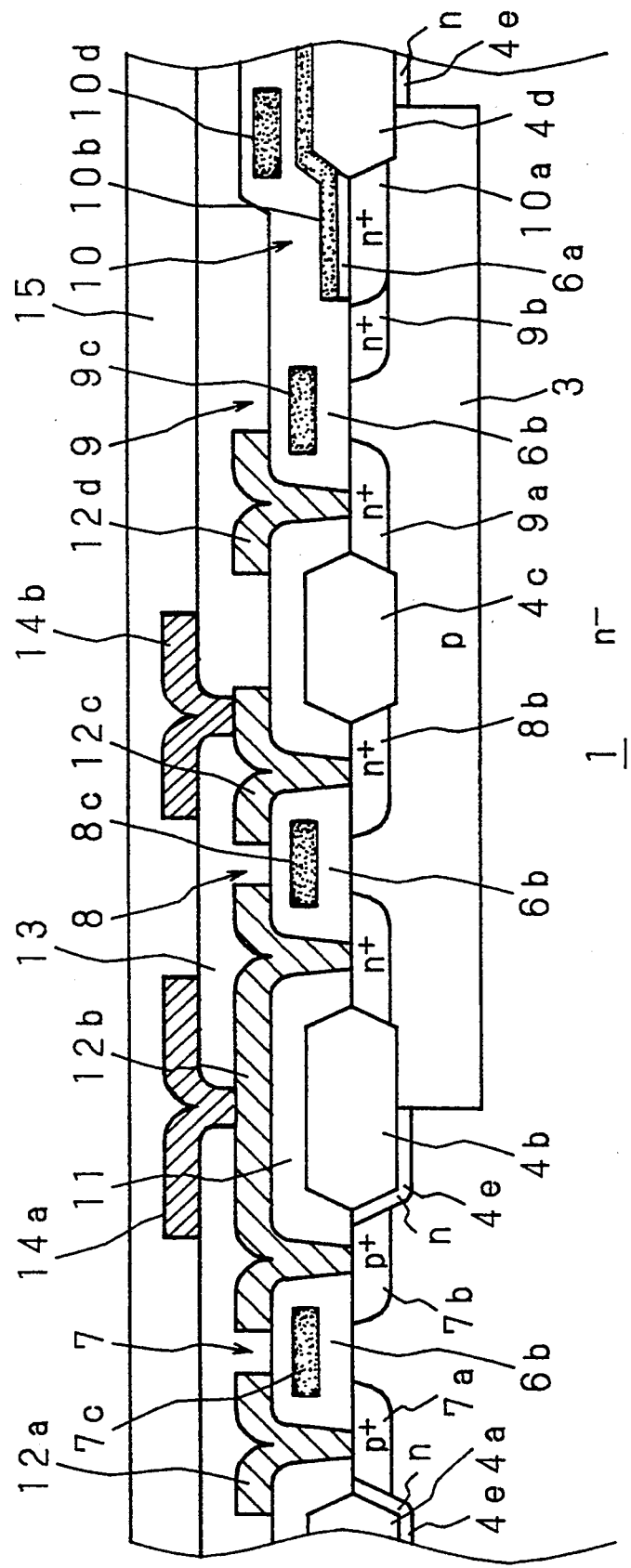
FIG. 1 is a cross section showing the structure of a conventional DRAM.
Figure 2:
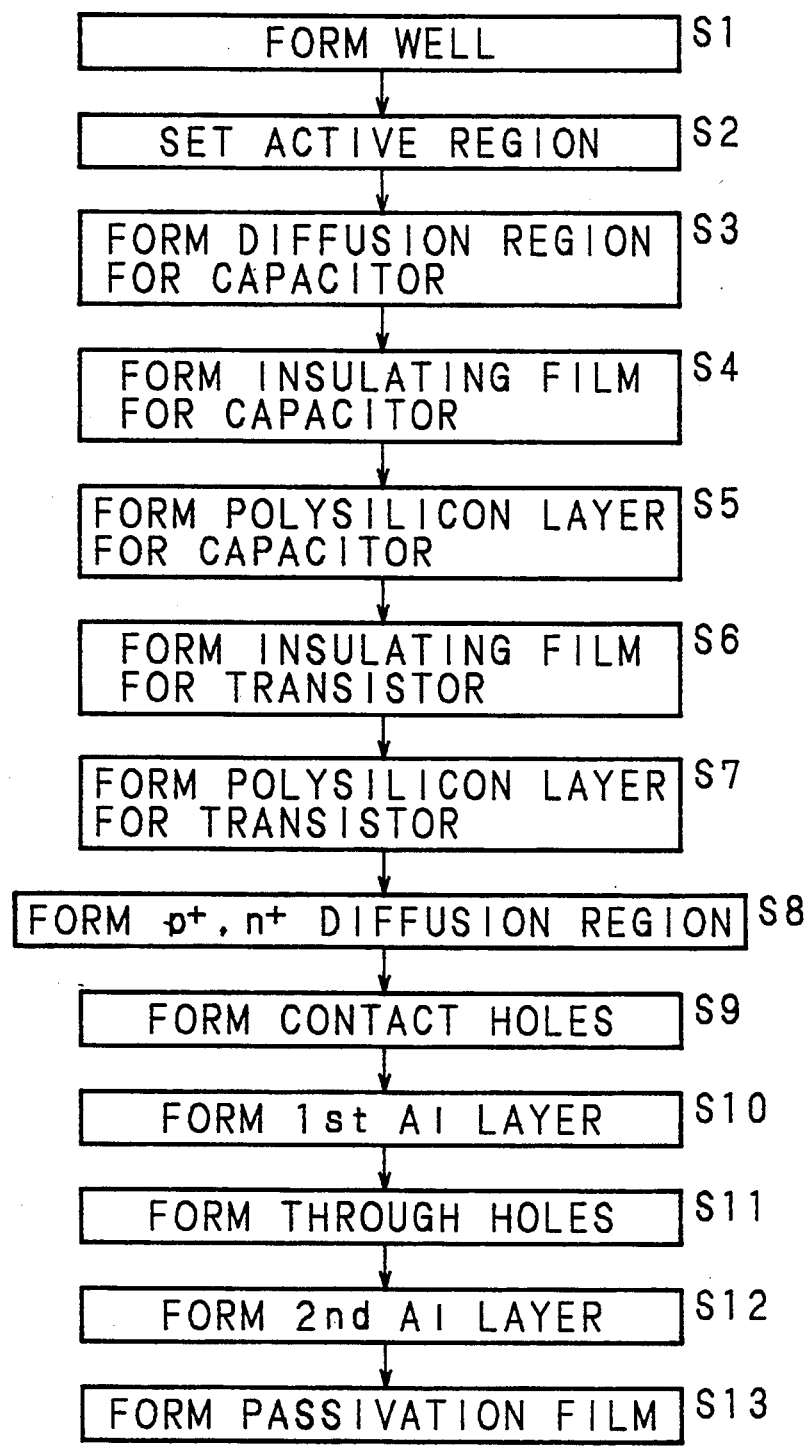
FIG. 2 is a flowchart of the essential manufacturing process of the conventional DRAM.
Figure 3:
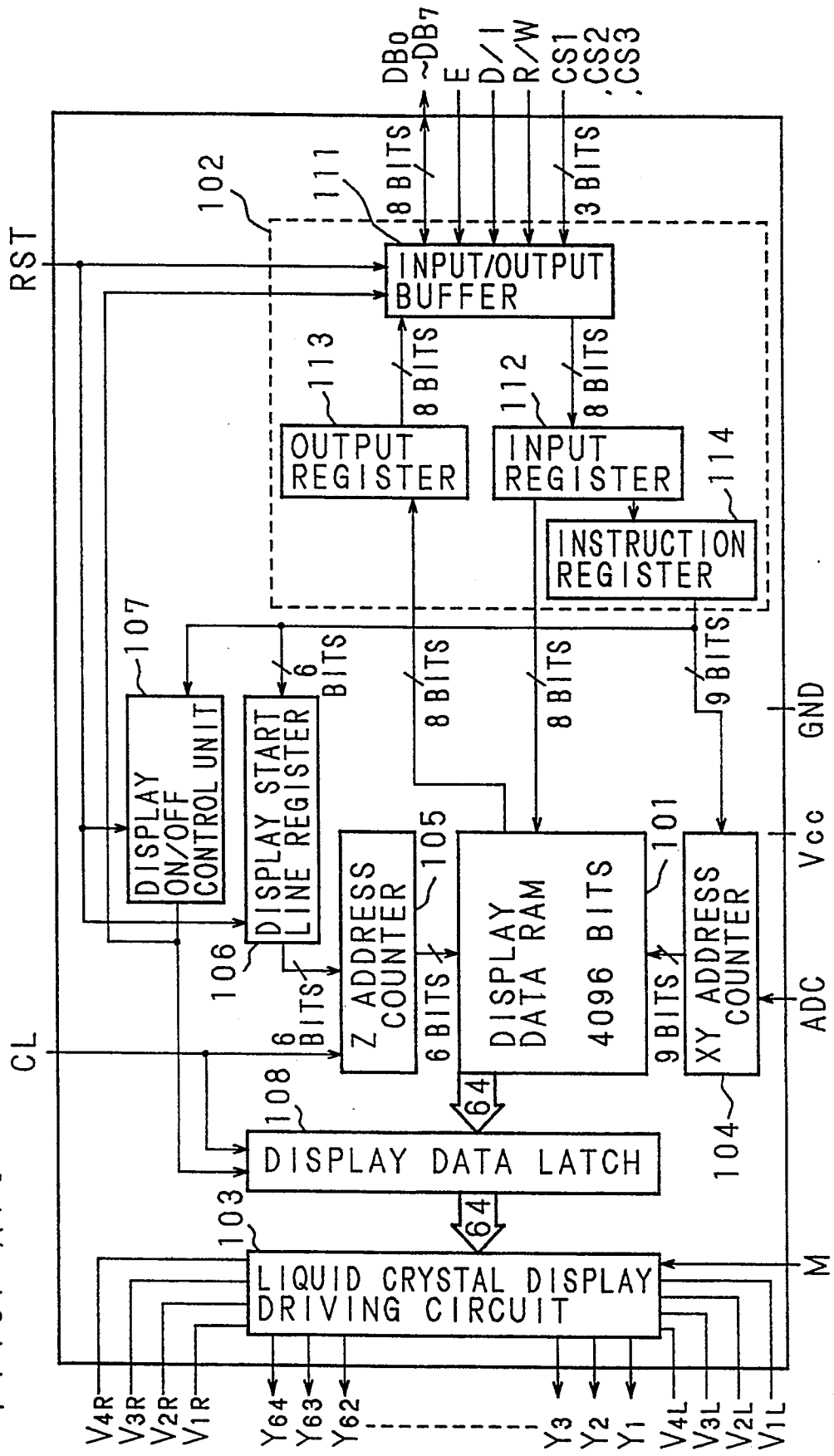
FIG. 3 is a block diagram of a conventional semiconductor device for driving a liquid crystal display circuit.
Figure 4:
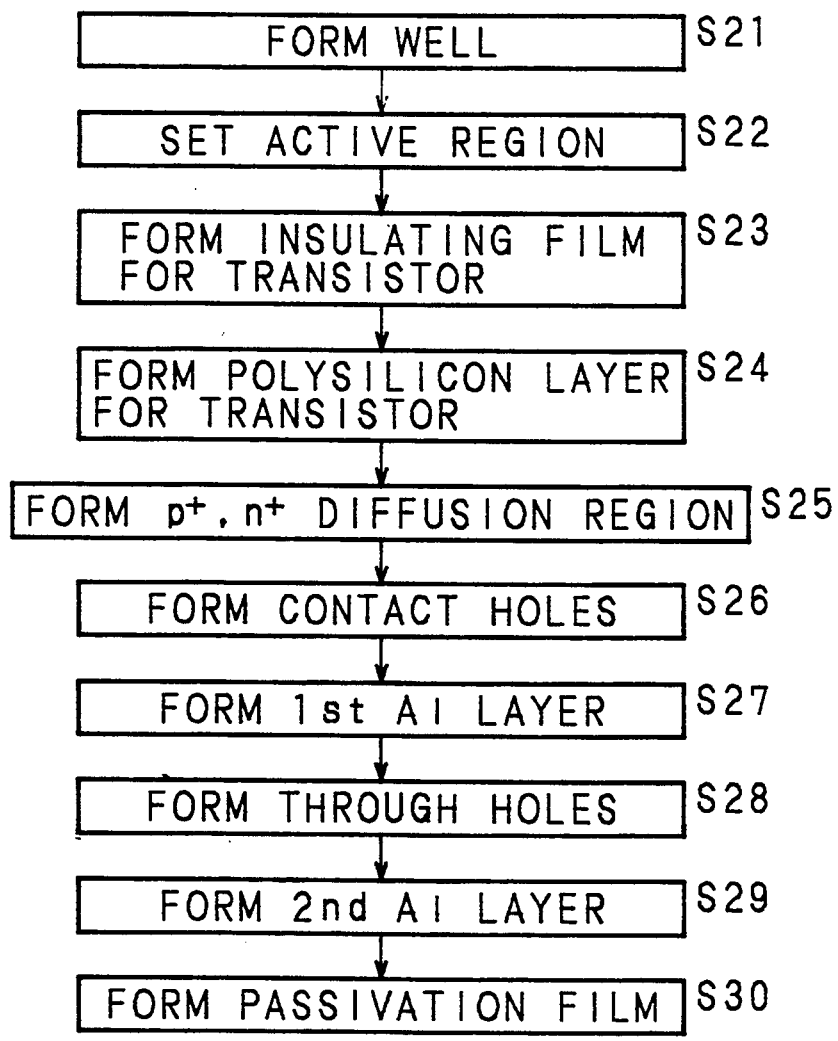
FIG. 4 is a flowchart showing the essential manufacturing process of an SRAM.

During the general write and read time to the display data RAM 101, the data is written through the input register 112 when the address generated by the XY address counter 104 is input, or read through the output register 113, in the same manner as in FIG. 3 of the conventional device. When the address generated by the Z Address counter 105 is fed to read the data to be displayed on the liquid crystal display, the data in the memory cells connected to the same word line is outputted to the 64-bit liquid crystal display driving circuit 103 through the 64-bit display data latch 108.

The XY address counter 104 generates an address based on the correlative data between an address of the SRAM and an output of the segment driver and the address data from the instruction register 114. Meanwhile, the Z address counter 105 generates an address based on the external clock CL and the display start line data inputted from the display start line register 106. The addresses from the XY address counter 104 and the Z address counter 105 are supplied to the display data RAM 101.

The interface control unit 102 is equipped with the input/output buffer 111, the input register 112, the output register 113 and the instruction register 114. An enable signal E, a data/instruction signal D/I, a read/write signal R/W, a reset signal RST, a display ON/OFF signal and chip section data CS1, CS2, CS3 etc. are inputted to the input/output buffer 111 from a CPU and a ROM (not shown). At the same time, the input/output buffer 111 feeds the data $DB_0-DB_7$ to be written and a control signal to the input register 112. Moreover, the input/output buffer 111 sends the read data from the output register 113 to the input register 112.

The input register 112 outputs the data to form an address and a control signal to the instruction register 114 and, the write data $DB_0-DB_7$ to the display data RAM 101. The instruction register 114 is connected to the XY address counter 104, the display start line resister 106 and the display ON/OFF control unit 107, with giving the address data to the XY address counter 104 and the display start line register 106. The instruction register 114 also feeds a control signal to the display ON/OFF control unit 107 and a word line source circuit 109.

The reset signal RST is inputted with a suitable timing to each of the input/output buffer 111, the display start line register 106, and the display ON/OFF control unit 107. An ON or OFF signal from the display ON/OFF control unit 107 is sent to the input/output buffer 111 and the display data latch 108, thereby controlling the operation timing of the buffer 111 and the latch 108.

The word line source circuit 109 impresses a predetermined voltage to a word line so as to compensate for both a voltage drop of the switch transistor constituting the memory cell, and a leak current in the diffusion region 10a for the capacitor 10 of the memory cell and in the junction part of the diffusion region 9b of the transistor. The display data latch 108 is arranged to receive the external clock CL and the ON or OFF signal of the display ON/OFF control unit 107, thereby to latch the display data from the display data RAM 101 based on the above signals, The display data is outputted to the display driving circuit 104 which generates a liquid crystal display driving signal. In FIG. 10, $V_{1R}-V_{4R}, V_{1L}-V_{4L}$ are liquid crystal display driving power sources.

According to this driving device, the data is written, read to the display data RAM 101 or displayed in the same manner as in the conventional device of FIG. 3.

FIG. 11 is a timing chart of the operation when the driving device drives the liquid crystal display, more specifically, FIG. 11(a) showing an access clock to read out the data for liquid crystal display and FIG. 11 (b) an access clock to write the data in an usual manner. For the access clock to read out the data for liquid crystal display, pulses 1 μsec wide are generated at every 5 μsec as indicated in FIG. 11 (a). Each pulse is assigned with an address ADD0, ADD1 . . . In other words, a word line is selected and one cycle is completed in 10 msec.

That is, the access to the display data RAM 101 for liquid crystal display is executed to all the addresses serially within a fixed period. A refresh control for the DRAM is realized by this access, accordingly making it unnecessary to provide a refresh control circuit for the DRAM. The same simple manufacturing process as for the SRAM is achieved from this point of view.

The usual write and read operation to the display data RAM 101 is done between time read and write access clock, for instance, in accordance with the write access clock, as shown in FIG. 11(b).

The specification and characteristics of a semiconductor memory used in the semiconductor device of this invention having so-called 1 polysilicon-2 Al structure where the gate electrode of the MOS transistor in the logic section and the gate electrode and the capacitor electrode in the memory cell section are formed of the material of the first electrode material layer on the substrate, comparing with those of the conventional full CMOS SRAM with 1 polysilicon-2 Al structure, is shown in Table 1. As is clear from the table, the cell size and the memory cell area are remarkably small in comparison with those of the full CMOS SRAM and, refreshment control circuit is not required similar to the SRAM. Moreover, the manufacturing process is simplified so much as is not be different from that of the full CMOS SRAM.

According to the semiconductor device and the manufacturing method of this invention, as compared with the conventional DRAM with 2 polysilicon-2 Al structure, the forming process of the capacitor can be considerably simplified, the manufacturing costs can be reduced and the yield is improved. Further, although the memory area becomes larger than the conventional DRAM, its influence to the chip size can be neglected in the case of a logic-rich ASIC or the like. Even in the case of a memory-rich IC, considering that the manufacturing cost can be reduced and the yield is improved, this invention is more advantageous than the DRAM.

Besides, the memory area on the substrate can be reduced greatly in comparison with the SRAM, so that the chip size can be small. The number of the effective chips per wafer increases although the process to form the diffusion region for the capacitor adds. Accordingly, the increase of the process cost is restricted as a whole. Further, when a memory area of a large capacity is necessary, this invention fulfills such a necessity that is not satisfied by the SRAM.

According to the semiconductor device for driving a liquid crystal display circuit of this invention, a semiconductor memory is used as a display data RAM, which memory has the gate electrodes in the logic section, and the gate electrode and the capacitor electrode in the memory cell section formed by the first electrode material layer on the substrate, a large memory capacity can be gained easily. Moreover, in the case where a large memory capacity RAM is required to enhance the display gradation or to increase the number of segments, etc., though the manufacturing process of the SRAM is simpler than that of the DRAM, the DRAM is still advantageous in that the total cost is lower because of the reduction of the chip area, etc. Besides, the manufacturing process similar to that of the SRAM is enough. By applying the semiconductor device of this invention to drive a liquid crystal display circuit where the access to the DRAM for display is serially carried out to the whole addresses within a fixed period, the access to the DRAM works as a refresh control for the DRAM, without requiring a special refresh control circuit.

As this invention may be embodied in several forms without departing from the spirit of essential characteristics thereof, the present embodiment is therefore illustrative and not restrictive, since the scope of the invention is defined by the appended claims rather than by the description preceding them, and all changes that fall within the meets and bounds of the claims, or equivalence of such meets and bounds thereof are therefore intended to be embraced by the claims.

What is claimed is:

1. A semiconductor device comprising:
   a substrate;
   a memory cell composed of a transistor and a capacitor formed on said substrate, wherein a gate electrode of said transistor and an electrode of said capacitor are formed in the same process;
   a logic circuit for turning on and off the transistor of said memory cell in accordance with access and non-access to said memory cell, which is composed of a transistor with a gate electrode formed in the same process with said gate electrode of the transistor and said electrode of the capacitor such that said capacitor electrode and said gate electrodes each extend, at least in part, in the same plane within said semiconductor device.

2. A semiconductor device for driving a liquid crystal display, comprising:
   a substrate;
   a RAM for storing displaying data for each pixel in each memory cell, which includes arrayed memory cells, each cell being composed of a transistor and a capacitor formed on said substrate with a gate electrode of said transistor and an electrode of said capacitor being formed in the same process, and a logic circuit for turning on and off the transistor of said memory cell, being composed of a transistor with a gate electrode formed in the same process with the gate electrode and the capacitor electrode of said memory cell such that said capacitor electrode and said gate electrodes each extend, at least in part, in the same plane within said semiconductor device;
   means for outputting display data to a liquid crystal display driving circuit by serially accessing all of the memory cells of said RAM; and
   means for accessing to write the next display data in all of the memory cells of said RAM after the preceding data is outputted.

3. A semiconductor device for driving a liquid crystal display circuit as set forth in claim 2, wherein said means for accessing to write the next display data in all the memory cells of the RAM, includes means for accessing to write a determined quantity of the next display data each time the determined quantity of data among all the display data is outputted to the liquid crystal display driving circuit.

4. A semiconductor device as set forth in claim 1, wherein said capacitor electrode and said gate electrodes are formed of the same material.

5. A semiconductor device as set forth in claim 2, wherein said capacitor electrode and said gate electrodes are formed of the same material.

6. A semiconductor device as set forth in claim 1, wherein said capacitor electrode and said gate electrodes extend in said plane in a horizontal direction, and wherein said capacitor electrode and said gate electrodes do not overlap in a vertical direction.

7. A semiconductor device as set forth in claim 2, wherein said capacitor electrode and said gate electrodes extend in said plane in a horizontal direction, and wherein said capacitor electrode and said gate electrodes do not overlap in a vertical direction.

* * * * *